United States Patent
Byers et al.

(10) Patent No.: US 7,127,319 B2
(45) Date of Patent: Oct. 24, 2006

(54) REDUCING ASYMMETRICALLY DEPOSITED FILM INDUCED REGISTRATION ERROR

(75) Inventors: Erik Byers, Boise, ID (US); Steve W. Bowes, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 252 days.

(21) Appl. No.: 10/932,771

(22) Filed: Sep. 2, 2004

(65) Prior Publication Data

US 2005/0027388 A1    Feb. 3, 2005

Related U.S. Application Data

(60) Continuation of application No. 10/122,786, filed on Apr. 15, 2002, now Pat. No. 6,795,747, which is a division of application No. 09/816,861, filed on Mar. 23, 2001, now Pat. No. 6,486,956.

(51) Int. Cl.
*G06F 19/00* (2006.01)

(52) U.S. Cl. ...................................... 700/121
(58) Field of Classification Search ............... 700/121; 438/401, 16, 14; 356/601, 401
See application file for complete search history.

(56) References Cited

U.S. PATENT DOCUMENTS

| | | | |
|---|---|---|---|
| 4,794,646 A | 12/1988 | Takeuchi et al. | 382/8 |
| 5,057,689 A | 10/1991 | Nomura et al. | 250/310 |
| 5,414,519 A | 5/1995 | Han | 356/401 |
| 5,498,500 A | 3/1996 | Bae | 430/22 |
| 5,602,492 A | 2/1997 | Cresswell et al. | 324/763 |
| 5,617,340 A | 4/1997 | Cresswell et al. | 364/571.01 |
| 5,641,960 A | 6/1997 | Okubo et al. | 250/310 |
| 5,659,172 A | 8/1997 | Wagner et al. | 250/307 |
| 5,699,282 A | 12/1997 | Allen et al. | 364/571.01 |
| 5,857,258 A | 1/1999 | Penzes et al. | 29/846 |
| 5,953,128 A | 9/1999 | Ausschnitt | |
| 5,965,309 A | 10/1999 | Ausschnitt | |
| 6,033,582 A | 3/2000 | Lee | |
| 6,040,618 A | 3/2000 | Akram | 257/586 |
| 6,050,279 A | 4/2000 | Goad | |
| 6,064,486 A | 5/2000 | Chen et al. | 356/401 |
| 6,077,756 A | 6/2000 | Lin et al. | 438/401 |
| 6,091,845 A | 7/2000 | Pierrat et al. | 382/144 |
| 6,137,578 A | 10/2000 | Ausschnitt | |
| 6,143,629 A | 11/2000 | Sato | |

OTHER PUBLICATIONS

Aronson, Arnold J., *Fundamentals of Sputtering*, Microelectronic Manufacturing and Testing, Jan. 1987, vol. 10, No. 1, pp. 22-23.
Van Zant, Peter, Microchip Fabrication: A Practical Guide to Semiconductor Processing, Fourth Edition, 2000, pp. 411-416.
Wolf, Stanley, et al., *Aluminum Thin Films and Physical Vapor Deposition in ULSI*, Silicon Processing for the VLSI Era, vol. 1: Process Technology, Second Edition, Chapter 11, pp. 434-487, 2000.

*Primary Examiner*—Carl Whitehead, Jr.
*Assistant Examiner*—Monica D. Harrison
(74) *Attorney, Agent, or Firm*—Whyte Hirschboeck Dudek SC

(57) ABSTRACT

Methods, systems, products and apparatuses are disclosed herein relating to registration and asymmetrically deposited films, and more specifically, to reducing asymmetrically deposited film induced registration measurement error.

51 Claims, 4 Drawing Sheets

REDUCING ASYMMETRICALLY DEPOSITED FILM INDUCED REGISTRATION ERROR

CROSS REFERENCE TO RELATED APPLICATION

This application is a continuation of U.S. patent application Ser. No. 10/122,786, filed Apr. 15, 2002, now U.S. Pat. No. 6,795,747, which is a division of U.S. patent application Ser. No. 09/816,861, filed Mar. 23, 2001, now U.S. Pat. No. 6,486,956, which is incorporated herein by reference in its entirety.

FIELD OF THE INVENTION

The present invention generally relates to semiconductor processing for integrated circuits. In one aspect, the present invention relates to reducing error in layer-to-layer overlay alignment. In another aspect, the invention relates to registration methods for asymmetrically deposited films, and more specifically, methods for reducing asymmetrically deposited film induced registration measurement error.

BACKGROUND OF THE INVENTION

Integrated circuits (IC's) are formed by sequentially creating layers on an integrated circuit substrate, such as a semiconductor substrate. These layers can include: insulating layers, polysilicon layers, and conducting layers, such as silicide or metal layers. The layers can be patterned or etched to form IC parts or features (e.g., electronic components, interconnections and the like).

For an IC to operate properly, structures within overlying layers must properly align with one another. However, as integrated circuits become more dense and complex, it is becoming increasingly difficult to achieve registration of overlying structures. Misalignment between the layers can be a limiting factor in achieving increased IC integration density and a functioning device.

Generally, registration of one patterned layer with another can be achieved using special registration marks that are designed into each layer. When the registration marks of one patterned layer are registered with those of a previously patterned layer, it can be assumed that the remainder of the patterned layer is also properly registered with that of the previously-patterned layer.

Monitoring and adjustment of the alignment process was originally performed by human operators using a microscope. The decreasing size of integrated circuit features and layers, and the increasing number of layers per wafer, have contributed to the development of automated alignment processes using specialized tools known in the art. Such tools, including but not limited to: proximity printers, projection printers, aligners and steppers, generally provide systems, methods and computer program products for aligning a pattern with respect to underlying or previous patterns, and/or to the underlying substrate. Such exposure tools (also called a "patterning tool") are described in greater detail, for example, in U.S. Pat. No. 6,064,486, the disclosure of which is incorporated by reference herein.

The registration mark(s) (also referred to herein as "overlay mark(s)" and "registration measurement structures") may not be symmetrical, however, thus making it more difficult to find the center position of the registration mark. Moreover, even if the registration mark is symmetrical, subsequent processing can create an asymmetric coating that can include one or more additional layers on or adjacent to the registration mark. Asymmetry in such a coating, or in the mark itself, can result in an asymmetric registration signal that can cause registration of a patterned structure to be measured or perceived incorrectly.

If the registration structure comprises a raised feature or component (e.g., a mesa) or a depressed feature or component (e.g. a trench) on an integrated circuit substrate, one or more material layers may be formed onto the feature. Such layers can be formed asymmetrically over the feature due to the topography of the feature (e.g., raised or depressed), itself and/or due to asymmetries in the film or coating forming process. For example, metal deposition and photoresist film or coatings processes can produce asymmetries over the surface of a substrate. Such asymmetric films can make it difficult to accurately define the centerline of the registration mark, and thus, induce an asymmetric film registration error that can cause misalignment between consecutive layers of an IC.

Deposition processes are referred to as "metal deposition processes" when the material layer being deposited is a metallic material. Sputtering of a metal onto a silicon wafer is one specific example of an "asymmetric deposition process". Sputtering techniques (also known as physical vapor deposition or "PVD") are well known in the art. See Wolf and Tauber, *Silicon Processing for the VLSI Era*, Vol. 1, Chpt. 11, (Lattice Press 2000); Zant, *Microchip Fabrication*, pp. 411–16 (McGraw-Hill 2000); and Aronson, "Fundamentals of Sputtering", *Microelectronics Manufacturing and Testing*, January 1987. Examples of conventional sputtering techniques include high density plasma (HDP) or collimated sputtering. Another exemplary conventional sputtering process is the sputtering of aluminum for metal interconnects.

Attempts have been made to reduce and/or eliminate registration error caused by asymmetrically deposited films. For example, one solution has included an attempt to develop distinctive overlay marks, such as "chopped overlay marks". However, while such overlay marks can work to affect the way asymmetric films are deposited, current registration tools and associated methods for their use have heretofore been unable to appropriately obtain accurate registration data. This has been the case for a variety of reasons, one of which is that the metal film that is deposited on registration marks can appear opaque to a broadband light of the kind typically used in current registration tools.

Accordingly, it would be desirable to provide methods, apparatuses and systems for reducing asymmetric film induced registration error in the semiconductor industry.

SUMMARY OF THE INVENTION

The present invention relates generally to semiconductor fabrication techniques and, more particularly, to the reduction, and potentially the elimination, of asymmetric film induced registration error is disclosed herein. The method, apparatuses, and systems disclosed herein ideally solve the aforementioned problems and reduce such false overlay error in a cost-effective manner.

In one aspect, the invention provides methods for reducing registration measurement error due to an asymmetrically deposited film using critical dimensions. The method employs a registration measurement structure formed in overlying upper and lower layers of a semiconductor construction, the lower layer comprising a first component of the registration measurement structure, and the upper layer comprising a second component of the registration measurement structure, the first component comprising a first edge and a second edge, and a first distance from the first edge to the second edge, and the second component comprising a first edge and a second edge. An exemplary registration structure comprises a box-in-box registration structure. One hallmark of the method is that critical dimensions of an overlay structure can be determined, and using the critical dimension determinations in conjunction with overlay measurements, registration error can be substantially reduced, and potentially eliminated.

In one embodiment of the method, the method comprises acquiring data from the first component of the registration measurement structure to provide a first critical distance value from the first edge to the second edge; acquiring data from the position of the first component in relation to the second component to provide an apparent registration measurement; acquiring data from the first component having an asymmetrical film layer deposited thereon, to provide a second critical distance value from the first edge of the first component to an edge of the film layer disposed contiguously to the first edge of the first component; comparing the second distance value to the first distance value to generate an alignment error value corresponding to a third distance value measured from said edge of the film layer to the second edge of the first component; comparing the apparent registration measurement and the third distance value to remove the alignment error and generate an actual registration value; and conveying the actual registration value to a patterning apparatus for aligning a subsequent layer to the structure.

In another embodiment, the method comprises determining a first critical dimension of the registration structure; determining an apparent registration measurement of the registration structure; measuring a second critical dimension of the registration structure when the registration structure comprises an asymmetrically deposited film; using the first critical dimension and the second critical dimension to determine the registration measurement error of the registration structure due to the asymmetrically-deposited film; subtracting the registration measurement error from the apparent registration measurement of the registration structure to generate a corrected data representative of an actual registration of the registration structure; and conveying the actual registration data to a patterning apparatus to align a subsequently patterned layer relative to the structure.

In another aspect, the invention provides methods for reducing registration measurement error due to an asymmetrically deposited film using gate imaging techniques. The method likewise uses a registration measurement structure as described hereinabove, which has a centerline value.

In one embodiment of the method, the method comprises obtaining a pair of gate images of the first material layer (first component) of the registration structure; determining an image centerline value of each of the images of the first material layer; averaging the image centerline values of the first material layer images to provide a first offset centerline value; obtaining a pair of images of the second material layer of the registration structure; determining an image centerline value of each of the images of the second material layer; averaging the image centerline values of the second material layer images to provide a second offset centerline value; comparing the first offset centerline value with a second offset centerline value to provide a first delta value ($\Delta_1$); manipulating the pair of images of the first material layer to obtain flipped images of the first material layer; determining an image centerline value of each of the flipped images of the first material layer; averaging the image centerline values of the first material layer flipped images to provide a third offset centerline value; comparing the third offset centerline value to the second offset centerline value to provide a second delta value ($\Delta_2$); subtracting the $\Delta_1$ value from the $\Delta_2$ value to provide a $\Delta_s$ value, and averaging the $\Delta_s$ value to provide a registration measurement error; subtracting the registration measurement error from the registration structure centerline value to generate a corrected data representative of an actual centerline value of the registration structure; and conveying the actual centerline value of the registration structure to a patterning apparatus to align a subsequently patterned layer relative to the registration structure.

In another embodiment, the method comprises obtaining a pair of images of the first material layer of the registration structure; determining an image centerline value of each of the images of the first material layer; averaging the image centerline values of the first material layer images to provide a first offset centerline value; obtaining a pair of images of the second material layer of the registration structure; determining an image centerline value of each of the images of the second material layer; averaging the image centerline values of the second material layer images to provide a second offset centerline value; comparing the first offset centerline value with a second offset centerline value to provide a first delta value ($\Delta_1$); manipulating one of the pair of images of the first material layer resulting in a flipped image and a non-flipped image of the first material layer; determining an image centerline value of the flipped image and the non-flipped image of the first material layer; averaging the image centerline values of the flipped image and the non-flipped image of the first material layer to provide a third offset centerline value; comparing the third offset centerline value to the second offset centerline value to provide a second delta value ($\Delta_2$); subtracting the $\Delta_1$ value from the $\Delta_2$ value to provide a $\Delta_s$ value corresponding to a registration measurement error; subtracting the registration measurement error from the registration structure centerline value to generate a corrected data representative of an actual centerline value of the registration structure; and conveying the actual centerline value of the registration structure to a patterning apparatus to align a subsequently patterned layer relative to the registration structure.

In another embodiment, the method comprises obtaining a pair of images of the first material layer of the registration structure; manipulating one of the pair of images of the first material layer resulting in a first flipped image and a non-flipped image of the first material layer; determining an image centerline value of the first flipped image and the non-flipped image of the first material layer; averaging the image centerline values of the first flipped image and the non-flipped image of the first material layer to provide a first offset centerline value; obtaining a pair of images of the second material layer of the registration structure; determining an image centerline value of each of the images of the second material layer; averaging the image centerline values of the second material layer images to provide a second offset centerline value; comparing the first offset center line value with a second offset centerline value to provide a first delta value ($\Delta_1$); manipulating a second of the pair of images of the first material layer resulting in first and second flipped images of the first material layer; determining an image centerline value of the second flipped image of the first material layer; averaging the image centerline values of the first and second flipped images to provide a third offset centerline value; comparing the third offset center line value to the second offset centerline value to provide a second delta value ($\Delta_2$); subtracting the $\Delta_1$ value from the $\Delta_2$ value to provide a $\Delta_s$ value corresponding to a registration measurement error; subtracting the registration measurement error from the registration structure centerline value to generate a corrected data representative of an actual centerline value of the registration structure; and conveying the actual centerline value of the registration structure to a patterning apparatus to align a subsequently patterned layer relative to the registration structure.

In another embodiment, the method comprises obtaining at least two images representative of a registration site that comprises an asymmetric deposition layer; measuring the images to obtain a first data set; flipping the two images to obtain flipped images; measuring the flipped images to obtain a flipped data set; comparing the first data set to the flipped data set to obtain an amount corresponding to the difference between the first and flipped data sets; removing the difference so as to obtain a true site offset data set substantially free of site error; and outputting the true site offset data set to counter registration site non-uniformity.

In another aspect, the invention provides a system for reducing registration measurement error caused by asymmetric film deposition. In one embodiment, the system comprises means for determining a first critical dimension of an alignment structure when the alignment structure is free of a asymmetrically deposited film; means for measuring a second critical dimension of the alignment structure when the structure includes an asymmetrically deposited film; means for comparing the first critical dimension to the second critical dimension to obtain an offset amount; and means for using the offset amount to achieve reduced registration measurement error due to the asymmetrically deposited film, the error reduced between the one layer and another layer in the integrated circuit.

In another aspect, the invention provides a system providing means for reducing registration measurement error cause by asymmetric film deposition using gate images.

In another aspect, the invention provides a computer readable medium on a computer. The computer readable medium comprises computer executable instructions for the foregoing methods.

In yet another aspect, the invention provides a computer programmed product for reducing registration measurement error using critical dimensions. In one embodiment, the computer program product comprises a computer readable storage medium having a computer-readable program code means embodied in the medium, and the computer-readable program code means comprises computer-readable program code for determining a first critical dimension of an alignment structure when the alignment structure is free of an asymmetrically deposited film; computer-readable program code for measuring a second critical dimension of the alignment structure when the structure includes an asymmetrically deposited film; computer-readable program code for comparing the first critical dimension to the second critical dimension to obtain an offset amount; and computer-readable program code for using the offset amount to achieve reduced registration measurement error due to the asymmetrically deposited film.

In yet another aspect, the invention provides a computer programmed product for reducing registration measurement error using gate images. The computer program product comprises a computer readable storage medium having a computer-readable program code means embodied in the medium, and the computer readable program code means comprises computer-readable program code for accomplishing the registration measurement error reduction.

In yet another embodiment, the invention provides a registration system. In one embodiment, the registration system comprises: (a) a registration measurement structure disposed within overlying layers of a semiconductor construction, a first component of the registration measurement structure disposed within a first layer of the semiconductor construction and comprising first and second edges and a distance therebetween, and a second component of the registration measurement structure disposed within a first layer of the semiconductor construction and comprising first and second edges; (b) a registration apparatus operable for acquiring image data of: i) the first and second edges of the first component, ii) the first and second edges of the second component, iii) an edge of a film layer asymmetrically deposited onto the second edge of the first component, and iv) the first or second edge of the first component in relation to the first edge of the second component; (c) a processor operable for producing distance values between said edges from the acquired image data, the distance values comprising (i) a first distance measured from the first edge to the second edge of the first component, and ii) a second distance measured from the first edge of the first component to the edge of the asymmetrically deposited film layer; (d) the processor further operable for producing an apparent registration measurement of the first component in relation to the second component based on measurements of the first or second edge of the first component to the first edge of the second component; (e) the processor further operable for comparing the second distance value to the first distance value to generate an alignment error value corresponding to a third distance between the edge of the asymmetrically deposited film layer and the second edge of the first component; (f) the processor further operable for comparing the apparent registration measurement and the alignment error value to generate an actual registration value corresponding to the position of the second component relative to the first component; and (g) the processor further operable to convey the actual registration value to a patterning apparatus for aligning a subsequent layer to the registration measurement structure.

In yet another embodiment, a registration system is provided similar to that described in the previous paragraph in which registration system accomplishes registration measurement error reduction using gate images.

Various other embodiments, features, objects and advantages of the present invention will be made apparent from the following detailed description and the drawings.

BRIEF DESCRIPTION OF THE DRAWINGS

The various features, objects and advantages of this invention are best understood with reference to the preferred embodiments when read in conjunction with the following drawings.

DETAILED DESCRIPTION OF THE PREFERRED EMBODIMENTS

Figure 1A:
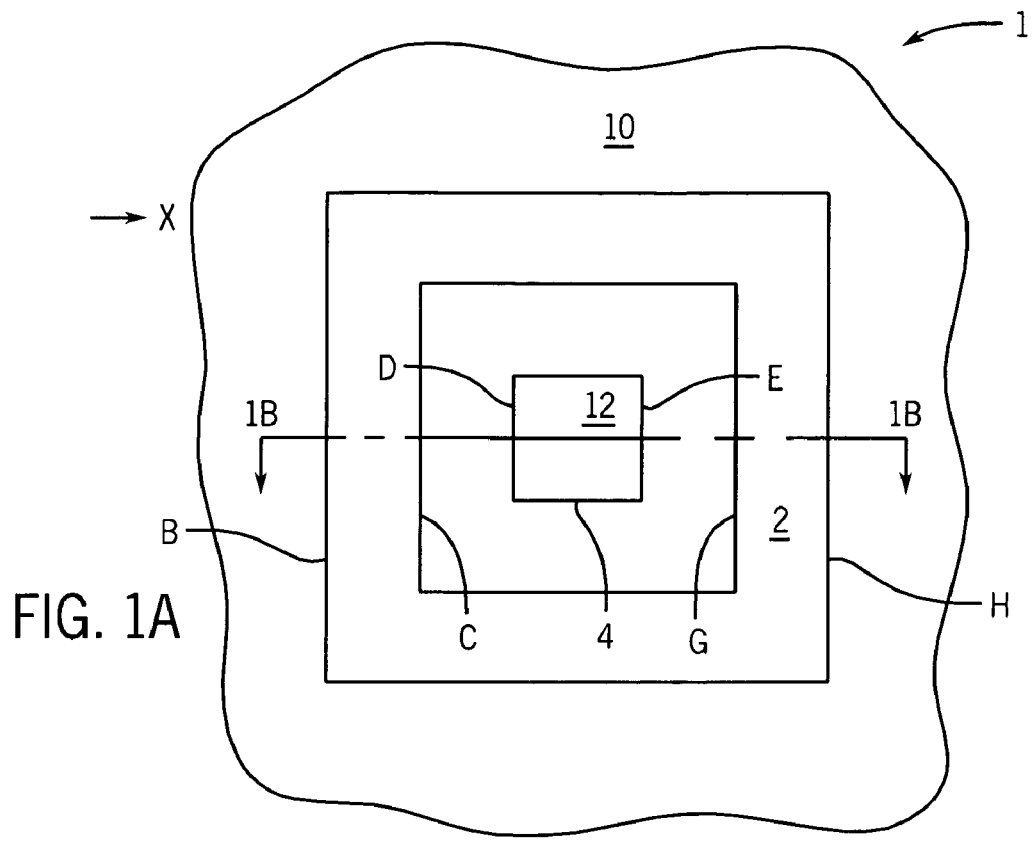
FIG. 1A shows an enlarged schematic top view of a conventional box-in-box registration structure.

The embodiments of this invention are described with reference to consecutive layers (i.e., a photomask or reticle layer on a substrate), but these methods are applicable to any of the various material layers (described above) used to fabricate a semiconductor integrated circuit.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above.

A conventional registration measurement structure comprises a "box-in-box" overlay structure (also called a "target" or "site") that typically comprises two or more overlay components (marks), and represents or describes the overlay of a given material layer with respect to a previously deposited material layer at a single site (also called a "point" or "location") on a readable field of a wafer. Such registration measurement structures are repeated at various points across the wafer. With respect to a box-in-box registration structure, significant information can be obtained at each site, for instance, by measuring or at least two different directions (e.g., in a typical Cartesian coordinate system, measuring in an "x" and a "y" direction). Information or data can be obtained in this manner across an entire silicon wafer. This data can then be analyzed, modeled, or otherwise manipulated so as to accomplish various tasks, such as, for example, to reduce or remove overlay error and achieve proper registration of a subsequently deposited layer with respect to previous layers. Such overlay error can be caused by certain tooling or IC fabrication processes.

Automatic metrology systems (not shown here) are typically designed to accomplish swift, precise, and unattended registration measurements of semiconductor features, including registration measurement structures, for example, the box-in-box registration structure described herein. Such systems are programmable and include a specialized imaging tool (e.g., an optical system), an autofocus mechanism (e.g., a laser focusing system), and a specialized optical microscope, and are typically electronically-controlled. One registration tool suitable for use with respect to the present invention is an IVS registration tool (e.g., the IVS-120 optical metrology tool) available from Schlumberger Automated Test Equipment (ATE), located in San Jose, Calif. The tool includes an adaptive RG software algorithm that provides the capability to measure targets using images of the targets that are created by the image sensing and optical apparatuses in the registration tool. KLA-Tencor Corporation, located in San Jose, Calif., also manufacturers a variety of suitable registration software packages, sold under the brand name KLASS™.

Registration tools can detect a position of overlay marks that make up, for example, a box-in-box registration structure on a substrate. The registration tool typically images the substrate and registration structure(s) using an optical system which can include a radiation source and a radiation detector (neither of which is shown) to produce a registration signal that is processed by a processor (also not shown). Imaging of the registration structure on the substrate can be accomplished by capturing two-dimensional or three-dimensional images of the registration structure using an image detector (not shown), such as a charge coupled device (CCD) camera so as to provide data of the registration structure to the processor.

The electrical, mechanical and optical design of registration tools are conventional and well known to those of skill in the art. It will be understood by those having skill in the art that the processor utilized in conjunction with the registration tool can comprise a microprocessor, an Application-Specific Integrated Circuit (ASIC), or any other combination of hardware and or/software. It will also be understood by those of skill in the art that the processor can be designed as part of an existing processor of a registration tool, or alternatively, as a stand-alone processor.

Registration is typically obtained by imaging registration measurement structures generally comprising components (marks) on a substrate. Exemplary substrates comprise silicon, silicon nitride, silicon dioxide, silicon carbide, gallium arsenide or other semiconductor material. In general, the registration measurement structure comprises a first component in a first or lower layer of a semiconductor construction, and a second component in an overlying second or upper layer. The registration tool then typically determines, based on the image and/or reference points on the first component, the relative position of the second component of the registration measurement structure. It then creates a signal based on that image or reference points.

Ideally, the second component is symmetrically positioned with respect to the first component, and its center position is well defined. However, as described above, metal deposition processes can result in an asymmetric layer being deposited onto the first component of the registration measurement structure, resulting in an inaccurate or false measurement being taken of the registration structure. The false measurement is then sent as a signal to the patterning apparatus, even though the second component itself may be symmetrically positioned. Due to the registration error caused by the asymmetric film deposition on the first component of the registration structure, it can be difficult to determine a center position of the second component.

Figure 1B:
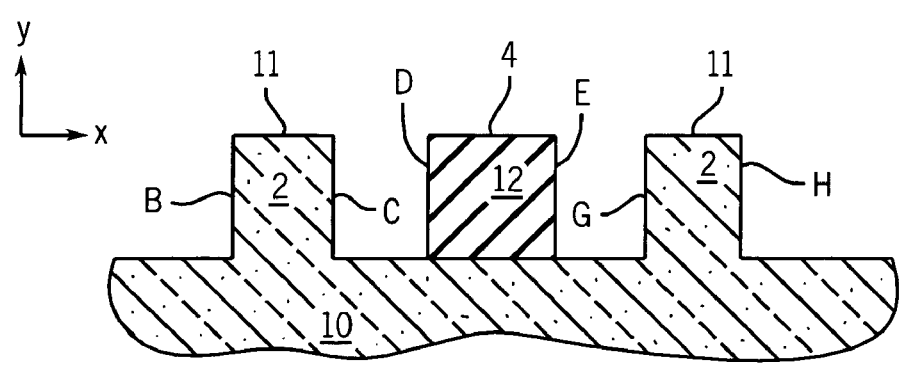
FIG. 1B shows an enlarged schematic cross-sectional view taken along line 1B—1B of FIG. 1A.

Referring now to FIGS. 1A–1B, a first embodiment of the invention is described with reference to a method of reducing registration error caused by asymmetrical deposition processes.

Referring to FIGS. 1A and 1B, top and cross-sectional views, respectively, of box-in-box registration measurement structure 1 are shown. A first component 2 comprising a larger box formed as raised area or "mesa" in the shape of a square is formed over or in a substrate layer 10.

Raised first component 2 comprises a top edge 11. A second component 4 comprising a smaller box comprising a photoresist layer is formed as a top layer 12 over the larger box 2 and substrate 10 to correspond with the first component 2. The photoresist layer can comprise a variety of photosensitive polymeric materials for example, a novalac resin.

As shown in FIGS. 1A–1B and 2A–2B, the first component 2 of the registration structure 1 can be a raised structure such as a mesa that is formed in a substrate 10. As shown in FIG. 2C, the first component 2' can also be a recessed structure or trench etched into a substrate layer 10'. The first component 2 can be formed to be about 1 to about 4 microns (μm) wide, or more preferably, about 2 to about 4 microns (μm) wide. The height of the first component 2 is typically about 0.1 to about 0.5 microns (μm) or more preferably about 0.3 to about 0.5 microns (μm). The above-described dimensions can vary widely depending on the specific application and are provided by way of example only. Although described as mesas (or trenches), it will be understood that the shape of a registration measurement structure 1 can vary to convenience depending on the application at hand. For example, other suitable shapes for the registration measurement structure can include crosses, chevrons, among others. The registration structure can be made according to well-known, conventional fabrication processes.

Figure 2A:
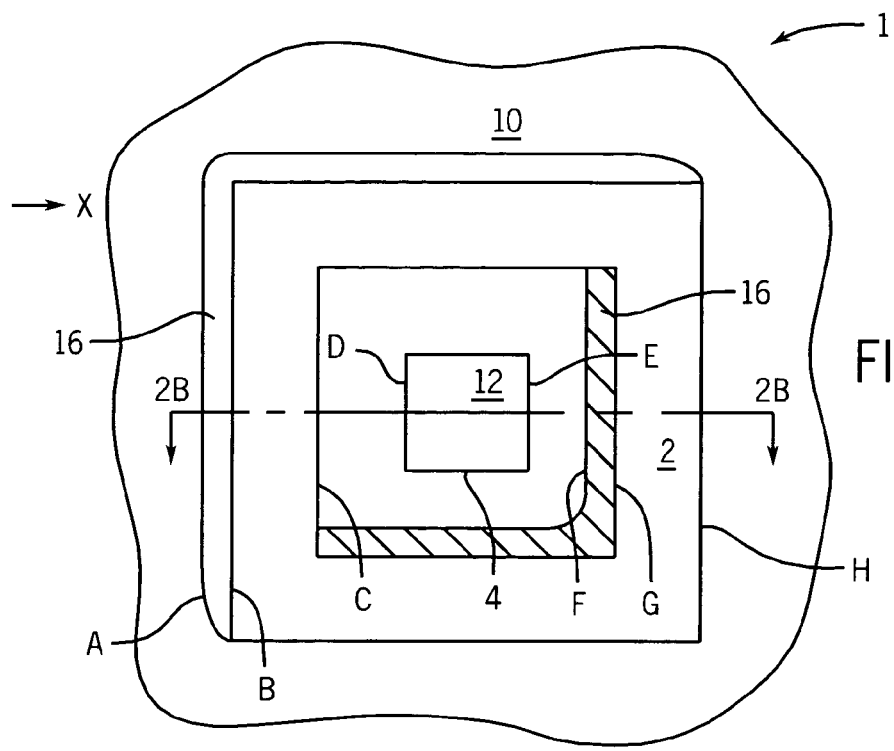
FIG. 2A shows an enlarged schematic top view of a box-in-box registration structure comprising an asymmetrically deposited material layer.

As shown in FIGS. 1A and 2A, the registration measurement structure 1 is shown without a material layer (16) deposited over the first component 2 of the structure. The upper box (second component) 4 appears to be in alignment (i.e., registration) with the lower box (first component) 2. When there is no asymmetric deposition of a material on the first component of the registration measurement structure, distances such as height and width can be determined by measuring distances between edges (or other reference point) on the registration measurement structure. Such distances are referred to herein as "critical dimensions". For example, edges A through H of the registration measurement structure can be perceived or recognized by an imaging device, and thus measured, by a registration tool (not shown). As shown, the first component 2 of the registration structure comprises first and second edges B and C, the second component 4 comprises first and second edges D and E, and the asymmetric film layer comprises an edge A.

With respect to FIGS. 1A–1B, a registration structure that is free of an asymmetrically deposited film (16) is shown. Registration error, if any, between the overlay of the upper box (second component) 4 with respect to the lower box (first component) 2, can be obtained by determining the distance from edge C to edge D (referred to as "CD") and the distance from edge E to edge F, (referred to as "EF"). These distances can be compared, and the error can be substantially accounted for by the following subtraction one distance from the other, for example, distance CD minus distance EF (i.e., CD–EF).

Figure 2B:
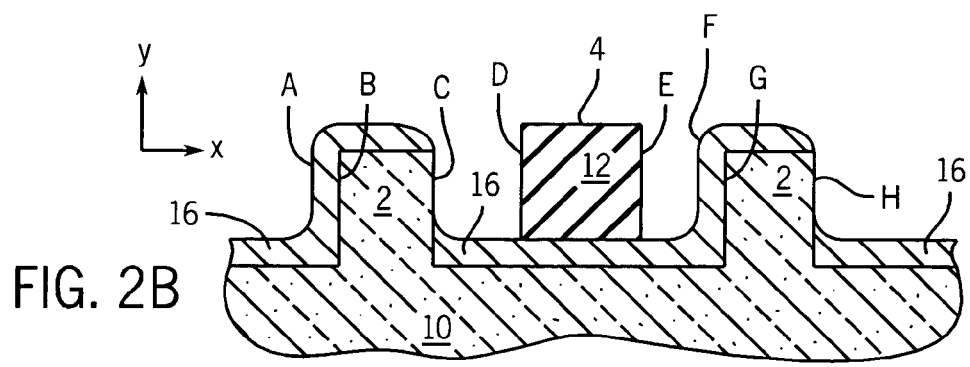
FIG. 2B shows an enlarged schematic cross-sectional view taken along line 2B—2B of FIG. 2A.
Figure 2C:
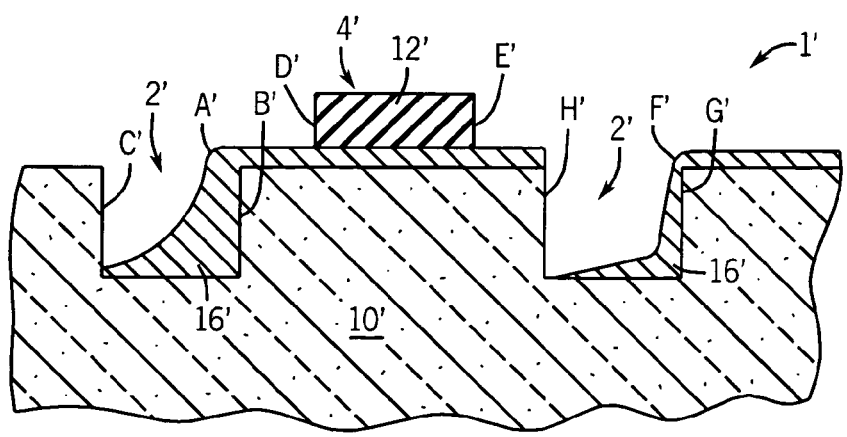
FIG. 2C shows another embodiment of a registration measurement structure comprising a recessed component and an asymmetrically deposited film layer

As shown in FIGS. 2A and 2B, metal deposition can result in an asymmetric layer 16 being deposited onto the first component (mesa) 2 of registration structure 1, and more specifically over certain portions of its topography, e.g., the metal process films or layers deposited onto certain edges of the first component (mesa) 2. For example, the deposited film can be thicker on one side of the first component (mesa) 2 than the other side.

Registration tools typically measure the registration structure from an edge to a centerline (or vice versa). A metal film 16 is typically deposited downwardly and at angle onto the substrate, in a set direction such as from left to right across the surface, or in radial fashion.

A deposited metal film 16 generally appears opaque to the imaging mechanism of a registration tool. As such, the registration tool cannot detect the true edges of the registration structure 2 through the opaque film, but images or measures the apparent edges of the registration structure 2 that includes an overlying film layer 16. One result of this is that the perceived (i.e., measured) edges A, C, D, E, F and H measured by a registration tool can be effectively offset by an amount corresponding to the thickness (width) of the film layer 16 as measured from edge A to edge B, which is contiguous to a reference edge (C) of the first component (trench, mesa) 2 of the registration structure. The registration tool images and transmits a registration signal of the registration structure 1 to a processor (not shown), with the registration signal including the offset amount due to the asymmetric deposition of the film layer 16. As a result of the inclusion of the offset amount in the registration image and signals, a subsequently deposited material layer (not shown), can be misaligned with respect to an underlying material layer.

As shown in FIGS. 2A and 2B, the first component (raised area or mesa) 2, is defined, at least in part, by edges B, C, G and H. As shown, the second component 4, exemplified by a photoresist layer, is formed onto a film layer 16 (e.g., metal) that has been asymmetrically deposited over the first component 2. The second component 4 is defined, at least in part, by edges D and E. As shown, the deposition of the film layer 16 can result in a build-up of material along one side of the first component 2. This forms asymmetric deposition edges "A" and "F", which are edges of the deposited material 16 that is contiguous with edges B and G of the first component.

Here, certain edges of the registration measurement structure (box-in-box) can be perceived or recognized, and thus measured, by a registration tool (not shown). As shown in FIGS. 2A–2B, measurable edges include asymmetric deposition edges A and F, and edges C, D, E, and H of the first and second components of the registration measurement structure. Edges B and G of the first component 2 of the registration structure, however, cannot be perceived or measured using the registration tool due to the generally opaque asymmetric film layer 16 that is deposited over these edges.

Thus, using a registration tool to determine the alignment of the second component 4 of a registration structure comprising an asymmetrically deposited film layer 16, can result in an erroneous or false registration measurement. The amount of the false registration measurement corresponds to the thickness of the asymmetric layer 16 contiguous to the edge B of the first component 2 of the registration structure, which can be represented by the distance from edge A of the asymmetric layer 16 to edge B of the first component 2 (i.e., distance AB), or alternatively—because of structure symmetry—the distance between edges F and G of the asymmetric layer 16 and the first component 2 of the second depicted registration structure (i.e., distance FG).

The width of the first component 2, or simply the critical dimension AC, can be obtained according to the known (or predetermined) dimensions of the pattern (e.g., mask or reticle) used in forming the first component 2. Dimension AC can also be determined by measuring and/or experimental sampling of registration structure components using methods known to those of skill in the art. Such critical dimensions can be measured using a registration tool or Critical Dimension Scanning Electron Microscope. As a practical matter, such a determination can desirably take place prior to asymmetric deposition of the metal layer. Measuring critical dimensions introduces error into the final overlay of one material layer to a subsequent material layer. However, such error is significantly less than the error that typically would result if the error due to asymmetric film deposition is not accounted for (i.e., the error to asymmetric film deposition is assumed to be negligible or zero).

Using the measurement data obtained above (i.e., the apparent registration error and critical dimensions AC and AB), the true or actual registration error due to asymmetric deposition (or amount of the registration offset corresponding to the thickness of the asymmetric deposition on the edge of the first component of the registration structure) can be calculated. By way of example, in the box-in-box registration structure illustrated, the registration error due to asymmetric deposition of the film layer 16 can be calculated as the difference between the magnitude of critical dimension (distance) AC and the magnitude of critical dimension (distance) BC, or simply, distance AC minus distance BC (i.e., AC−BC). This, of course, corresponds to the distance AB. Since the box-in-box registration measurement structure 1 that is shown is itself symmetrical, the offset or overlay error of the second component 4 relative to the first component 2 is equal to half the magnitude of the critical dimension (distance) BC (i.e., BC/2).

With the registration error due to asymmetric deposition having been determined, an actual registration value for the registration measurement structure 1 comprising an asymmetric deposition layer 16 can be determined. This actual value can be conveyed to a patterning apparatus to align a subsequent layer onto the substrate.

The amount of asymmetric deposition corresponding to the thickness of the deposition layer 16, can vary across the surface of the substrate. As such, the amount of asymmetric deposition is preferably measured, modeled and corrected for at each registration measurement structure (e.g., the box-in-box registration structure illustrated in here) across the wafer. That is, each structure 1, and each corresponding error determination, can be considered as a point. This process can be continuing, point-by-point, across a substrate. The points can be collected to create a data set. From this data set, an overall alignment error for overlying patterned layers of an IC can be determined and/or modeled, and overall alignment of the layers can be achieved.

A key feature of this invention is that the critical dimension determinations are utilized to obtain an error or offset amount due to asymmetric film deposition. The offset amount can be conveyed to a patterning apparatus. Such error can be effectively subtracted out of or removed from the overall registration for a structure and, by continuing the process, across a wafer substrate.

As depicted in FIG. 2C, in another embodiment, the registration measurement structure 1' can comprise a first component 2' in the form of a recessed structure of trench. As shown, a film layer 16' has been asymmetrically deposited over the edge B' of the trench-structured first component 2'. Measurements can be taken with respect to edges A' through H' of the registration measurement structure 1' to determine and resolve the registration error in the alignment of the first and second components 2', 4', according to the method as described with respect to FIGS. 2A–2B.

Figure 3A:
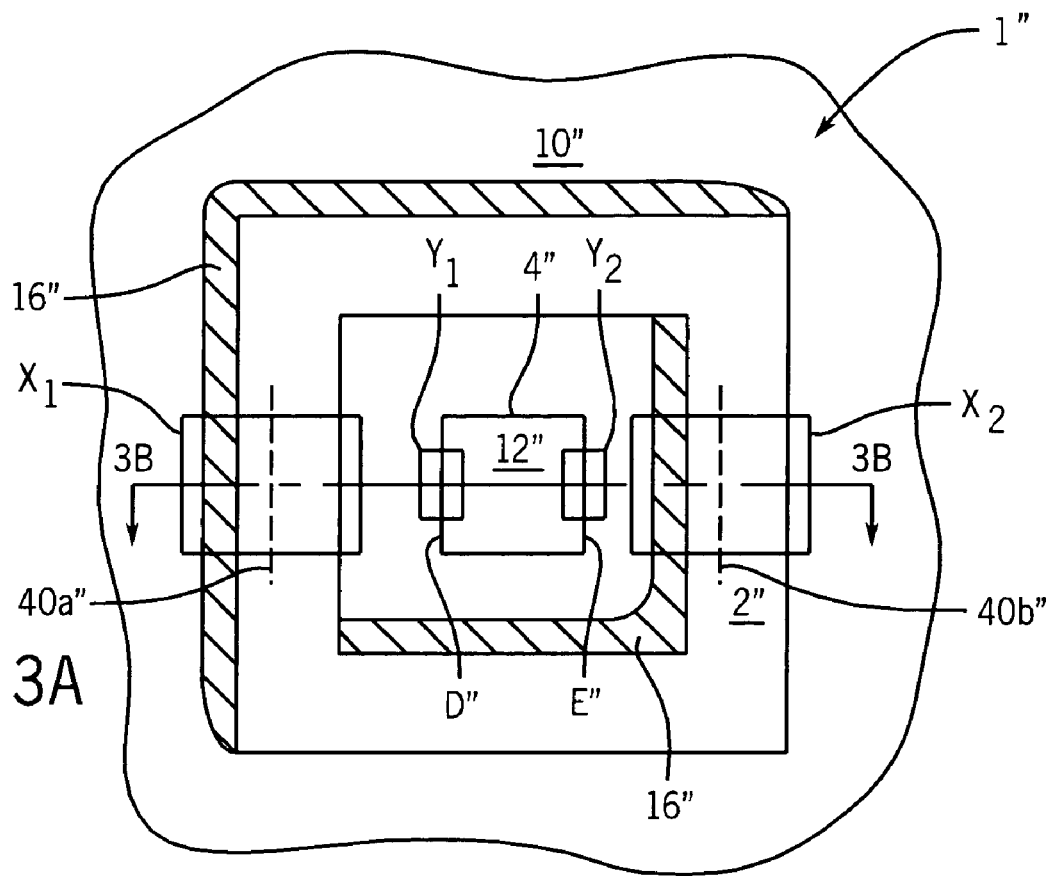
FIG. 3A shows an enlarged schematic top view of a box-in-box registration structure comprising an asymmetrically deposited material layer.
Figure 3B:
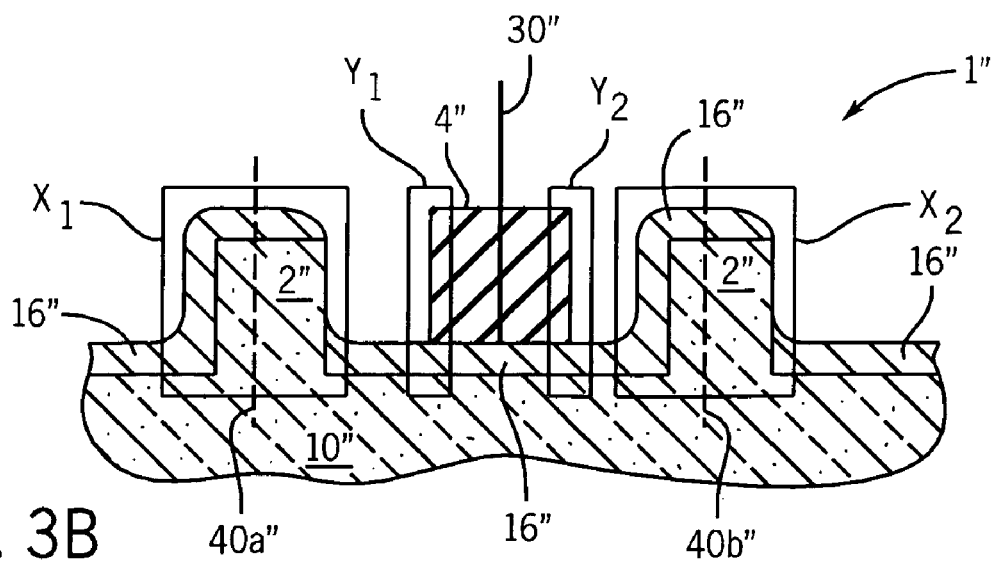
FIG. 3B shows an enlarged schematic cross-sectional view taken along line 3B—3B of FIG. 3A.
Figure 3C:
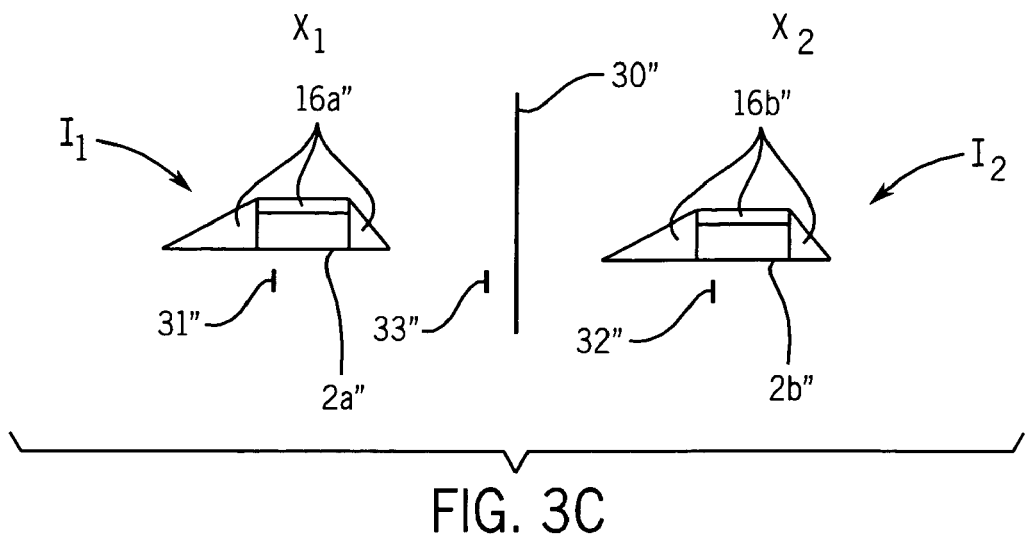
FIG. 3C shows a pair of enlarged measurement gate images of the outer box of the box-in-box registration structure of FIGS. 3A–3B comprising an asymmetric deposition layer.

Referring now to FIGS. 3A–3C, a second embodiment of a method according to the invention is described with reference to imaging a pair of gate images of a reference measurement structure to provide for improved site registration, or reduced (and potentially eliminated) registration error caused by asymmetrical deposition processes. Again, when a film layer (metal material) 16 is deposited onto a wafer substrate, for example, to create metal interconnects or other IC elements, components (which can, alone or in combination with other components, make up a registration measurement structure) are used to accomplish registration.

The true or actual centerline of the exemplary box-in-box registration structure 1" is indicated by solid line 30". The deposition of the material layer 16" can cause mis-registration between the outer box component 2" and the inner box component 4", which ultimately can result in the misalignment of overlying patterned layers by the amount by which the perceived or apparent site line is offset from the actual or true centerline 30" of the registration structure.

Still referring to FIGS. 3A–3B, left and right image gates $X_1$, $X_2$, are shown to overlie the first component 2" comprising a raised, larger outer box, of the registration structure 1". Image gates $Y_1$ and $Y_2$ are shown to overlie edges D" and E" of the second component 2" comprising the second component 4" comprising an inner, smaller box comprising, for example, a photoresist layer. A registration tool uses image gates $X_1$, $X_2$, $Y_1$ and $Y_2$ to determine where the centerline 30" of the outer and inner boxes 2", 4" of the registration structure 1" are located. A registration tool can be used to obtain the gate images by taking a contrast images (e.g., a CCD photograph).

As depicted, the registration measurement structure 1" comprises a first component (mark) 2", which is formed in a lower substrate layer. 10" using standard IC fabrication techniques, such as resist pattern and etch. The registration measurement structure 1" further comprises a second component (mark) 4" as a top or current layer, shown here as a photoresist layer. The first and second components 2", 4" are shown as identical or substantially identical in shape (i.e., as rectangles), thereby creating a symmetrical box-in-box design. Thus, an exemplary "ideal" registration measurement structure 1" is shown. It will be recognized and understood by those of skill in the art that the registration structure can be fabricated using known but imperfect manufacturing processes, which lead to imperfections in its shape.

Figure 3D:
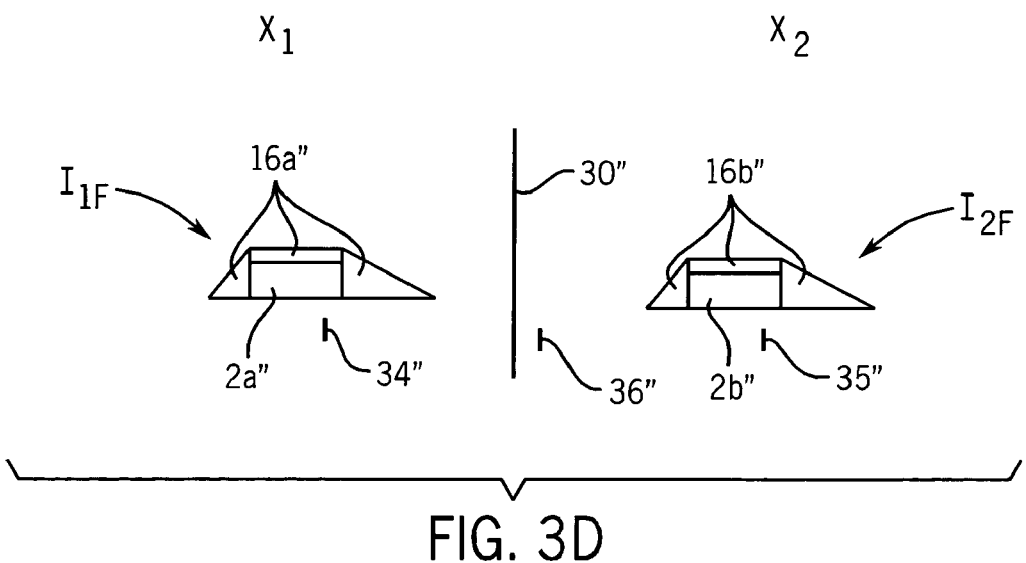
FIG. 3D shows a pair of enlarged measurement gate images of the outer box of the box-in-box registration structure of FIG. 3A–3B comprising an asymmetric deposition layer, the pair of images rotated with respect to the images of FIG. 3C.
Figure 3E:
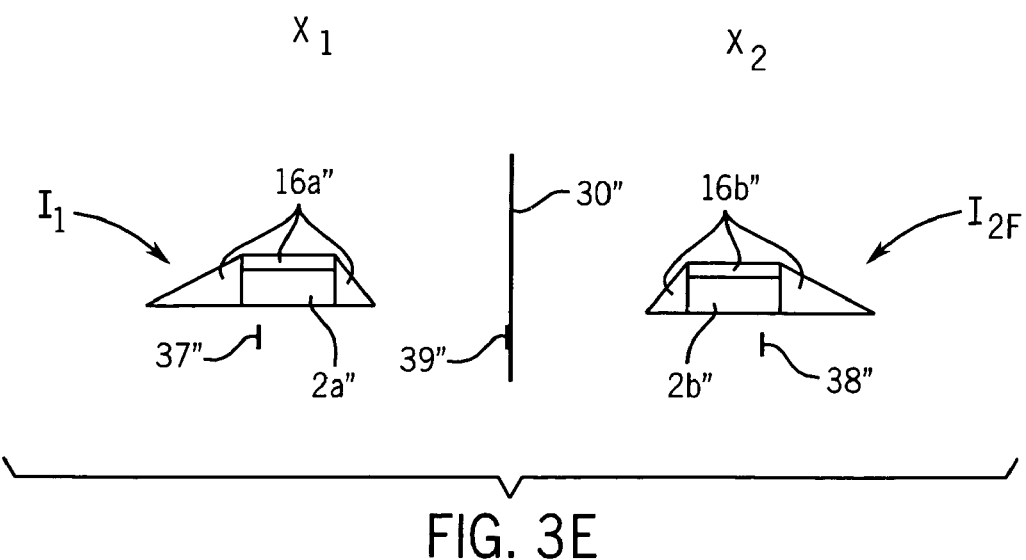
FIGS. 3E shows a pair of enlarged measurement gate images of the outer box of the box-in-box registration structure of FIGS. 3A–3B comprising an asymmetric deposition layer, one of the images rotated with respect to the images of FIG. 3C.

Referring to FIGS. 3C–3E, enlarged schematic images (referred to herein as "gate images") of registration structure 1" comprising the outer box (first component) portions 2a", 2b", and asymmetrically deposited film layer portions 16a" and 16b" are illustrated. More specifically, a pair of gate images $I_1$ and $I_2$ (as shown, left and right) can be used to determine the position of sides or edges of the illustrated box-in-box registration measurement structure.

As illustrated in FIG. 3C, asymmetric film deposition layer portions 16a", 16b" cause the registration tool to image the apparent centerline of outer box portion 2a" with deposition layer portion 16a" thereon as an offset line 31", and the apparent centerline of outer box portion 2b" with deposition layer portion 16a" thereon as an offset line 32". This, in turn, registers the apparent centerline of the overall box-in-box structure 1" (i.e. site center) as an offset or site line 33".

The registration tool accomplishes this determination by imaging a pair of images $I_1$ and $I_2$ of the outer box (first) component 2" of the registration structure, and determining a value of the apparent centerlines of each of the images $I_1$ and $I_2$ of the first material layer or component 2". The image centerline values are then averaged to provide a site line 33", or first offset centerline value. A pair of images delineated by the image gates $Y_1$ and $Y_2$ (not depicted) are also taken of the inner box (second) component 4" of the registration structure, and a value of the apparent centerlines of each of the images of the second material layer or component 4" are determined. The image centerline values of the second material layer images are then averaged to provide a second offset centerline value. The first offset centerline value is then compared with the second offset centerline value to provide a first delta value ($\Delta_1$), referred to as "site-induced-shift". Such registration measurements can be taken for each registration structure 1" across a wafer, and a data set created.

In a next step, the registration tool can electronically rotate or flip one or both of the gate images $I_1$, $I_2$ of the portions of the outer box components 2a", 2b", resulting in the image pairs shown in FIGS. 3D and 3E.

As illustrated in FIG. 3D, both gate images $I_1$, $I_2$ have been electronically flipped by the registration tool, resulting in flipped images $I_{1F}$, $I_{2F}$. As shown, each of the images have been flipped 180° about a central axis 40a", 40b" (FIGS. 3A–3B) of the image gates. Once flipped, the registration tool measures the apparent centerlines 34" and 35", respectively, of the outer box components 2a", 2b" so as to determine the amounts that the apparent centerlines 34" and 35" are offset from the true centerline 30". The image centerline values 34", 35" of the flipped images $I_{1F}$, $I_{2F}$, of the first material layer or component 2" are then determined and averaged to provide a site line 36", or third offset centerline value. The third offset center line value is then compared to the second offset centerline value to provide a second delta value ($\Delta_2$).

The $\Delta_1$ value is then subtracted from the $\Delta_2$ value to provide a $\Delta_s$ value, which is then averaged to provide a registration measurement error, which corresponds to the offset amount due to the asymmetric deposition of the film layer portions 16a", 16b". In general, the greater the averages $\Delta_s$ value, the greater the asymmetry of the film layer over the outer box component portions 2a", 2b". The registration measurement error is then subtracted from the registration structure centerline value to generate a corrected data representative of an actual centerline value of the registration structure. The actual centerline value of the registration structure is then conveyed to a patterning apparatus to align a subsequently patterned layer.

Typically the sputter (or other metal deposition process) tool (not shown) applies the metal or other material layer in a manner that introduces a radial asymmetry to the deposited film layer 16". In other words, for a registration structure 1" in which the first component 2" comprises a raised feature, an excess amount of material can be deposited onto one side of the wafer substrate resulting in a build-up of material along one side of the lower component 2" of a registration mark. When a registration tool then measures the field (i.e., one exposure from the exposure tool), the position of the raised feature 2" appears to be closer toward the wafer center than its actual position. Alternatively, if the lower component 2" comprises a trench, the position of the recessed feature 2" appears to be farther from the wafer center than its actual position. This phenomena is called "wafer magnification." Wafer magnification can be corrected or accounted for by entering a wafer magnification factor into the exposure tool to change the exposure tool stepping distance between field images.

In another embodiment of a method according to the invention, only one of two gate images (e.g., $I_1$ or $I_2$) is electronically rotated or flipped onto itself, as shown in FIGS. 3C and 3E. As shown, 12 (FIG. 3C) has been flipped to obtain flipped image $I_{2F}$, as depicted in FIG. 3E.

According to the method, a pair of images $I_1$, $I_2$ of the outer box (first component) 2" of the registration structure 1" are again obtained (FIG. 3C), and an image centerline value 37", 38" for each of the images $I_1$, $I_2$ is determined and averaged to provide a first offset centerline value.

A pair of images delineated by the image gates $Y_1$ and $Y_2$ (FIG. 3A) are also again taken of the inner box (second) component 4" of the registration structure, and a value of the apparent centerlines of each of the images of the second material layer or component 4" are determined and averaged to provide a second offset centerline value. The first and second offset centerline values are then compared to provide a first delta value ($\Delta_1$).

One of the images, here image $I_2$ of the outer box (first) component 2" has been flipped/rotated resulting in a flipped image $I_2F$ and a non-flipped image $I_1$, as shown in FIG. 3E. Once rotated or flipped, the registration tool can measure the respective apparent centerlines, 37" and 38" of the flipped image $I_2F$ and a non-flipped image $I_1$ of the outer box component portions 2a", 2b", and average the values to provide a site line 39", or third offset centerline value. The third offset center line value is then compared to the second offset centerline value to provide a second delta value ($\Delta_2$).

The $\Delta_1$ value is then subtracted from the $\Delta_2$ value to provide a $\Delta_s$ value which corresponds to a registration measurement error due to the asymmetric deposition of the film layer portions 16a", 16b". The registration measurement error is then subtracted from the registration structure centerline value to generate a corrected data representative of an actual centerline value of the registration structure. The actual centerline value is then conveyed to a patterning apparatus to align a subsequently patterned layer relative to the registration structure and the component 4".

One problem that can result from rotating only one of the gate images is the phenomenon of field magnification. Field magnification results when the image-sensing mechanism or apparatus magnifies a field comprising a plurality of registration structures or sites. Field magnification can be corrected or accounted for by a field magnification factor that can be entered into the exposure tool to reduce or increase the field magnification as needed.

In accordance with the present method, to eliminate such errors due to rotation of gate images (e.g., wafer magnification, field magnification, and translational shifts) and to account as well for the error associated with asymmetric film deposition, two measurements are taken. First, non-flipped gate image measurements are taken. Then, ether one gate image (e.g., $I_1$, or $I_2$) is flipped and measured, or both gate images (e.g., $I_1$ and $I_2$) are flipped and measured.

In another embodiment of this method, a pair of images $I_1$, $I_2$ of the outer box (first component 2") are obtained (FIG. 3C), and one of the pair of images is manipulated resulting in a first flipped image and a non-flipped image. Apparent image centerline values of the flipped and non-flipped images are determined and averaged to provide a first offset centerline value. A pair of images of the inner box (second component) 4" of the registration structure 1" are then obtained as described herein, and apparent image centerline values of each of the images of the inner box component) 4" are then determined and averaged to provide a second offset centerline value. The first and second offset centerline values are then compared to provide a first delta value ($\Delta_1$).

The other (non-flipped) image of the outer box component 2" is then flipped/rotated to provide a pair of flipped gate images $I_{1F}$, $I_{2F}$, and the image centerline values of the flipped images are determined and averaged to provide a third offset centerline value. The third offset centerline value is then compared to the second offset centerline value to provide a second delta value ($\Delta_2$). The $\Delta_1$ value is then subtracted from the $\Delta_2$ value to provide a $\Delta_s$ value corresponding to a registration measurement error, which is then subtracted from the registration structure centerline value to generate a corrected data representative of an actual centerline value of the registration structure. This actual centerline value of the registration structure can then be electronically transmitted to a patterning apparatus to align a subsequently patterned layer relative to the registration structure.

The present layer-to-layer overlay metrology can be used to measure the alignment accuracy between a photoresist layer and an underlying substrate layer, and also to determine the alignment accuracy of a photoresist mask for etching a substrate material and, if necessary, the photoresist can be removed or reworked.

It will be understood that the foregoing methods of the invention can be implemented by automated registration tools comprising computer program instructions and/or algorithms programmed therein. These computer program algorithms can be provided to a processor (not shown) or other programmable data processing apparatus to produce a machine, such that the instructions that execute on the processor or other programmable data processing apparatus create means for implementing the functions specified in the methods. These computer program instructions can also be stored in a computer-readable memory that can direct a processor or other programmable data processing apparatus to function in a particular manner, such that the instructions stored in the computer-readable memory produce an article of manufacture including instruction means which implement the functions specified in the methods.

Accordingly, the methods and illustrations provided herein support combinations of means of performing the specified functions, combinations of steps (i.e., one such combination comprising a single step, another such combination comprising two or more steps) for performing the specified functions and program instruction means for performing the specified functions. It will also be understood that each method can be implemented by special purpose hardware-based systems, such as the kind described above or other conventional systems, which can perform the specified functions or steps as described above and/or by combinations of special purpose hardware and computer instructions.

Overlay metrology is performed to determine how well one layer overlays to a previous layer. Thus, metrology compares a registration mark, generally referred to as a metrology mark, on a current layer with an registration mark on a previous layer. The registration or metrology tool detects the registration marks and determines the positions of the current and previous registration marks. From these positions, an overlay offset can be calculated. Accordingly, the present invention can be used to detect the positions of the current and previous overlay marks during the metrology phase.

While the present invention is described in the context of metal deposition processes, such as sputtering, it will be understood that the invention can apply to any film that can be deposited to have a varying thickness from one side of a feature (e.g., a transoral line, a pattern, etc.), or, from the center to the edge of, for example, a wafer.

The present invention has been described in terms of the preferred embodiments, and it is recognized that equivalents, alternatives, and modifications, aside from those expressly stated, are possible and within the scope of the appending claims.

What is claimed is:

1. A registration system, comprising:
  a registration structure comprising first and second components, and a material layer disposed over at least a portion of at least one of the components; and
  an apparatus operable to:
    determine a first critical dimension of the registration structure;
    determine an apparent registration measurement of the registration structure;
    determine a second critical dimension of the registration structure;
    determine a registration measurement error due to asymmetry of the material layer over the at least one component based on the measurements of the first and second critical dimensions of the registration structure; and
    subtract the registration measurement error from the apparent registration measurement to generate data of an actual registration of the registration structure.

2. A registration system, comprising:
  a registration structure comprising first and second components, and a material layer disposed over at least a portion of at least one of the components; and
  an apparatus operable to:
    determine a first critical dimension of a registration structure comprising first and second components, the first component disposed over at least a portion of the second component, and a material layer disposed over at least a portion of at least one of the components;
    determine an apparent registration measurement of the registration structure;
    determine a second critical dimension of the registration structure;
    determine a registration measurement error due to asymmetry of the material layer based on the measurements of the first and second critical dimensions of the registration structure; and
    subtract the registration measurement error from the apparent registration measurement to generate data of an actual registration of the registration structure.

3. A registration system, comprising:
  a registration structure comprising first and second components, and a material layer disposed over at least a portion of at least one of the components; and
  an apparatus operable to:
    determine a first critical dimension of a registration structure comprising first and second components, and a material layer disposed over at least a portion of at least one of the components;
    determine an apparent registration measurement of the registration structure;
    determine a second critical dimension of the registration structure;
    determine a registration measurement error due to asymmetry of the material layer based on the difference between the first and second critical dimensions of the registration structure; and
    generate data of an actual registration of the registration structure based on the difference between the apparent registration measurement and the registration measurement error.

4. A registration system, comprising:
a registration structure comprising first and second components, and a material layer disposed over at least a portion of at least one of the components; and
an apparatus operable to:
  determine a first critical dimension of a registration structure comprising first and second components, and a material layer disposed over at least a portion of at least one of the components;
  determine an apparent registration measurement of the registration structure;
  determine a second critical dimension of the registration structure;
  determine a registration measurement error due to an amount of registration offset corresponding to thickness of the asymmetric material layer on an edge of at least one of the components of the registration structure; and
  generate data of an actual registration of the registration structure based on the difference between the apparent registration measurement and the registration measurement error.

5. A registration system, comprising:
a registration structure comprising first and second components, and a material layer disposed over at least a portion of at least one of the components; and
an apparatus operable to:
  determine a first critical dimension of a registration structure comprising at least two components and a material layer disposed over at least a portion of at least one of the components;
  determine an apparent registration measurement of the registration structure;
  determine a second critical dimension of the registration structure;
  determine a registration measurement error due to asymmetry of the material layer over the at least one component based on the measurements of the first and second critical dimensions of the registration structure; and
  determine an actual registration value of the registration structure based on the difference between the apparent registration measurement and the registration measurement error.

6. A registration system, comprising:
a registration structure comprising first and second components, and a material layer disposed over at least a portion of at least one of the components; and
an apparatus operable to:
  determine a first critical dimension of a registration structure comprising at least two components and an overlying material layer asymmetrically disposed over at least a portion of at least one of the components;
  determine an apparent registration measurement of the registration structure;
  determine a second critical dimension of the registration structure;
  determine a registration measurement error based on the measurements of the first and second critical dimensions of the asymmetrical registration structure;
  generate data of an actual registration of the registration structure based on the difference between the apparent registration measurement and the registration measurement error; and
  convey the actual registration data to an alignment device.

7. A registration system, comprising:
a registration structure comprising first and second components, and a material layer disposed over at least a portion of at least one of the components; and
an apparatus operable to:
  determine a first critical dimension of a registration structure comprising a material layer disposed over at least a portion of the registration structure;
  determine an apparent registration measurement of the registration structure;
  determine a second critical dimension of the registration structure;
  determine a registration measurement error based on the difference between the first and second critical dimensions; and
  generate data of an actual registration of the registration structure based on the difference between the apparent registration measurement and the registration measurement error.

8. A registration system, comprising:
a registration structure comprising first and second components, and a material layer disposed over at least a portion of at least one of the components; and
an apparatus operable to:
  determine a first critical dimension of a registration structure comprising overlying upper and lower layers, the lower layer comprising a first component and the upper layer comprising a second component, each component having first and second edges, a material layer disposed over at least a portion of the registration structure;
  determine a first critical distance value from the first edge the second edge of the first component;
  determine an apparent registration measurement of the registration structure by the position of the first component relative to the second component;
  determine a second critical distance value from the first edge of the first component to an edge of the material layer contiguous with said first edge;
  determine an alignment error value based on the difference between the first and the second critical difference values; and
  generate an actual registration value of the registration structure based on the difference between the apparent registration measurement and the alignment error value.

9. The system of claim 8, wherein the method further comprises conveying the actual registration value to an alignment device.

10. A registration system, comprising:
a registration structure comprising first and second components, and a material layer disposed over at least a portion of at least one of the components; and
an apparatus operable to:
  determine a first critical dimension of a registration structure comprising at least two components, a material layer disposed over at least a portion of at least one of the components;
  determine an apparent registration measurement of the registration structure;
  determine a second critical dimension of the registration structure
  determine a registration measurement error due to asymmetry of the material layer over the at least one component based on the measurements of the first and second critical dimensions of the registration structure; and determine an actual registration value of the registration structure based on the difference between the apparent registration measurement and the registration measurement error.

11. A registration system, comprising:

a registration structure comprising first and second components, and a material layer disposed over at least a portion of at least one of the components; and an apparatus operable to:

obtain a pair of images of a first component of a registration structure, the registration structure comprising a centerline value;

determine an image centerline value of each of the pair of images of the first component;

determine a first offset centerline value by averaging the image centerline values of the first component;

obtain a pair of images of a second component of the registration structure;

determine an image centerline value of each of the pair of images of the second component;

determine a second offset centerline value by averaging the image centerline values of the second component;

determine a first delta value ($\Delta_1$) by comparing the first and second offset centerline values;

provide flipped images of the first component;

determine an image centerline value for each of the flipped images of the first component;

determine a third offset centerline value by averaging the image centerline values of the flipped images of the first component;

determine a second delta value ($\Delta_2$) by comparing the second and third offset centerline values;

determine a registration measurement error by subtracting the $\Delta_1$ value from the $\Delta_2$ value to provide a $\Delta_s$ value, and averaging the $\Delta_s$ value; and generate an actual centerline value of the registration structure by subtracting the registration measurement error from the registration structure centerline value.

12. The system of claim 11, wherein the apparatus is operable to convey the actual centerline value to an alignment device.

13. The system of claim 11, wherein the material layer is asymmetrical relative to the registration structure.

14. The system of claim 11, wherein the registration structure comprises an asymmetrical film.

15. A registration system, comprising:

a registration structure comprising first and second components, and a material layer disposed over at least a portion of at least one of the components; and an apparatus operable to:

obtain a pair of images representative of a registration site having a material layer disposed over at least a portion of the registration site;

measure the pair of images;

flip the pair of images to obtain flipped images;

measure the flipped images;

compare the pair of images to the flipped images to determine the difference between the images and flipped images; and remove the difference to obtain a true registration site offset value.

16. The system of claim 15, wherein the apparatus is operable to convey the true registration site offset value to an alignment device.

17. The system of claim 15, wherein the material layer is asymmetrical relative to the registration structure.

18. A registration system, comprising:

a registration structure comprising first and second components, and a material layer disposed over at least a portion of at least one of the components; and an apparatus operable to:

obtain an image of a registration structure comprising at least two components and having a material layer disposed over at least a portion of the registration structure;

flip the image of the registration structure to obtain a flipped image;

generate an actual registration value of the registration structure based on the difference between the registration structure image and the flipped image.

19. A registration system, comprising:

a registration structure comprising first and second components, and a material layer disposed over at least a portion of at least one of the components; and an apparatus operable to:

generate a pair of images of a registration structure, the registration structure comprising at least two components and having a material layer disposed over at least a portion of at least one of the components;

generate a pair of flipped images of said registration structure images; and determine an actual registration value of the registration structure based on the difference between the registration structure images and the flipped images.

20. A registration system, comprising:

a registration structure comprising first and second components, and a material layer disposed over at least a portion of at least one of the components; and an apparatus operable to:

obtain a pair of images of a first component of a registration structure, the registration structure comprising a centerline value;

determine an image centerline value of each of the pair of images of the first component;

determine a first offset centerline value by averaging the image centerline values of the first component;

obtain a pair of images of the second component of the registration structure;

determine an image centerline value of each of the images of the second component;

determine a second offset centerline value by averaging the image centerline values of the second component;

determine a first delta value ($\Delta_1$) by comparing the first and second offset centerline values;

flip one of the pair of images of the first component to provide a flipped image and a non-flipped image of the first component;

determine an image centerline value of the flipped and the non-flipped images of the first component;

determine a third offset centerline value by averaging the image centerline values of the flipped and the non-flipped images of the first component;

determine a second delta value ($\Delta_2$) by comparing the second and third offset centerline values;

determine a registration measurement error by subtracting the $\Delta_1$ value from the $\Delta_2$ value to provide a $\Delta_s$ value, and averaging the $\Delta_s$ value; and generate an actual centerline value of the registration structure by subtracting the registration measurement error from the registration structure centerline value.

21. A registration system, comprising:
a registration structure comprising first and second components, and a material layer disposed over at least a portion of at least one of the components; and
an apparatus operable to:
obtain a pair of images of a first component of a registration structure, the registration structure comprising a centerline value;
flip one of the pair of images of the first component to provide a first flipped image and a non-flipped image of the first component;
determine an image centerline value of the first flipped and the non-flipped images of the first component;
determine a first offset centerline value by averaging the image centerline values of the first flipped image and the non-flipped image of the first component;
obtain a pair of images of the second component of the registration structure;
determine an image centerline value of each of the images of the second component;
determine a second offset centerline value by averaging the image centerline values of the second component;
determine a first delta value ($\Delta_1$) by comparing the first and second offset centerline values;
flip the non-flipped image of the pair of images of the first component to provide first and second flipped images of the first component;
determine an image centerline value of the second flipped image of the first component;
determine a third offset centerline value by averaging the image centerline values of the first and second flipped images of the first component;
determine a second delta value ($\Delta_2$) by comparing the second and third offset centerline values;
determine a registration measurement error by subtracting the $\Delta_1$ value from the $\Delta_2$ value to provide a $\Delta_s$ value; and
generate an actual centerline value of the registration structure by subtracting the registration measurement error from the registration structure centerline value.

22. A registration system, comprising:
a registration structure comprising first and second components, each component having first and second edges, and a material layer disposed over at least a portion of at least one of the components; and
one or more apparatus operable to:
acquire image data of:
  the first and second edges of the first component;
  the first and second edges of the second component;
  an edge of the material layer disposed proximal to the second edge of the first component; and
  the first or second edge of the first component in relation to the first edge of the second component;
to measure a distance:
  from the first edge to the second edge of the first component to provide a first distance value;
  from the first edge of the first component to said edge of the material layer to provide a second distance value; and
  from the first or second edge of the first component to the first edge of the second component to provide an apparent registration measurement of the first component in relation to the second component; and
to compare:
  the first and second distance values to generate an alignment error value corresponding to a distance from said edge of the material layer and the second edge of the first component; and
  the apparent registration measurement and the alignment error value to generate an actual registration value corresponding to the position of the first component relative to the second component.

23. A registration system, comprising:
a registration structure comprising first and second components, and a material layer disposed over at least a portion of at least one of the components; and
an apparatus operable to:
obtain at least two images of a first component of a registration structure, the registration structure comprising a centerline value;
flip one of the two images of the registration structure to obtain a flipped image and a non-flipped image;
generate an actual registration value of the registration structure by comparing the flipped image to the non-flipped image to obtain a value of the difference between the images.

24. A registration system, comprising:
a registration structure comprising first and second components, and a material layer disposed over at least a portion of at least one of the components; and
an apparatus operable to:
generate at least two images of a first component of a registration structure, the registration structure comprising at least two components and having a material layer disposed over at least a portion of at least one of the components, the registration structure comprising a centerline value;
generate a flipped image of one of the two images of said registration structure; and
determine an actual registration value of the registration structure based on the difference between the flipped image and the other of the images.

25. A registration system, comprising:
a registration structure comprising first and second components, and a material layer disposed over at least a portion of at least one of the components;
an apparatus comprising a machine readable medium comprising machine readable instructions for causing a computer to perform a method comprising:
  determining a first critical dimension of a registration structure comprising first and second components, and a material layer disposed over at least a portion of at least one of the components;
  determining an apparent registration measurement of the registration structure;
  determining a second critical dimension of the registration structure;
  determining a registration measurement error due to asymmetry of the material layer over the at least one component based on the measurements of the first and second critical dimensions of the registration structure; and
  subtracting the registration measurement error from the apparent registration measurement to generate data of an actual registration of the registration structure.

26. The system of claim 25, wherein the method further comprises conveying the actual registration data to an alignment device.

27. The system of claim 25, wherein the material layer is asymmetrical relative to the registration structure.

28. The system of claim 25, wherein the registration structure comprises an asymmetrical film.

29. A registration system, comprising:
a registration structure comprising first and second components, and a material layer disposed over at least a portion of at least one of the components;
an apparatus comprising a machine readable medium comprising machine readable instructions for causing a computer to perform a method comprising:
  determining a first critical dimension of a registration structure comprising first and second components, the first component disposed over at least a portion of the second component, and a material layer disposed over at least a portion of at least one of the components;
  determining an apparent registration measurement of the registration structure;
  determining a second critical dimension of the registration structure;
  determining a registration measurement error due to asymmetry of the material layer based on the measurements of the first and second critical dimensions of the registration structure; and
  subtracting the registration measurement error from the apparent registration measurement to generate data of an actual registration of the registration structure.

30. A registration system, comprising:
a registration structure comprising first and second components, and a material layer disposed over at least a portion of at least one of the components;
an apparatus comprising a machine readable medium comprising machine readable instructions for causing a computer to perform a method comprising:
  determining a first critical dimension of a registration structure comprising first and second components, and a material layer disposed over at least a portion of at least one of the components;
  determining an apparent registration measurement of the registration structure;
  determining a second critical dimension of the registration structure;
  determining a registration measurement error due to asymmetry of the material layer based on the difference between the first and second critical dimensions of the registration structure; and
  generating data of an actual registration of the registration structure based on the difference between the apparent registration measurement and the registration measurement error.

31. A registration system, comprising:
a registration structure comprising first and second components, and a material layer disposed over at least a portion of at least one of the components;
an apparatus comprising a machine readable medium comprising machine readable instructions for causing a computer to perform a method comprising:
  determining a first critical dimension of a registration structure comprising first and second components, and a material layer disposed over at least a portion of at least one of the components;
  determining an apparent registration measurement of the registration structure;
  determining a second critical dimension of the registration structure;
  determining a registration measurement error due to an amount of registration offset corresponding to thickness of the asymmetric material layer on an edge of at least one of the components of the registration structure; and
  generating data of an actual registration of the registration structure based on the difference between the apparent registration measurement and the registration measurement error.

32. A registration system, comprising:
a registration structure comprising first and second components, and a material layer disposed over at least a portion of at least one of the components;
an apparatus comprising a machine readable medium comprising machine readable instructions for causing a computer to perform a method comprising:
  determining a first critical dimension of a registration structure comprising at least two components and a material layer disposed over at least a portion of at least one of the components;
  determining an apparent registration measurement of the registration structure;
  determining a second critical dimension of the registration structure;
  determining a registration measurement error due to asymmetry of the material layer over the at least one component based on the measurements of the first and second critical dimensions of the registration structure; and
  determining an actual registration value of the registration structure based on the difference between the apparent registration measurement and the registration measurement error.

33. A registration system, comprising:
a registration structure comprising first and second components, and a material layer disposed over at least a portion of at least one of the components;
an apparatus comprising a machine readable medium comprising machine readable instructions for causing a computer to perform a method comprising:
  determining a first critical dimension of a registration structure comprising at least two components and an overlying material layer asymmetrically disposed over at least a portion of at least one of the components;
  determining an apparent registration measurement of the registration structure;
  determining a second critical dimension of the registration structure;
  determining a registration measurement error based on the measurements of the first and second critical dimensions of the asymmetrical registration structure;
  generating data of an actual registration of the registration structure based on the difference between the apparent registration measurement and the registration measurement error; and
  conveying the actual registration data to an alignment device.

34. A registration system, comprising:
a registration structure comprising first and second components, and a material layer disposed over at least a portion of at least one of the components;
an apparatus comprising a machine readable medium comprising machine readable instructions for causing a computer to perform a method comprising:
  determining a first critical dimension of a registration structure comprising a material layer disposed over at least a portion of the registration structure;

determining an apparent registration measurement of the registration structure;
determining a second critical dimension of the registration structure;
determining a registration measurement error based on the difference between the first and second critical dimensions; and
generating data of an actual registration of the registration structure based on the difference between the apparent registration measurement and the registration measurement error.

35. A registration system, comprising:
a registration structure comprising first and second components, and a material layer disposed over at least a portion of at least one of the components;
an apparatus comprising a machine readable medium comprising machine readable instructions for causing a computer to perform a method comprising:
determining a first critical dimension of a registration structure comprising overlying upper and lower layers, the lower layer comprising a first component and the upper layer comprising a second component, each component having first and second edges, a material layer disposed over at least a portion of the registration structure;
determining a first critical distance value from the first edge the second edge of the first component;
determining an apparent registration measurement of the registration structure by the position of the first component relative to the second component;
determining a second critical distance value from the first edge of the first component to an edge of the material layer contiguous with said first edge;
determining an alignment error value based on the difference between the first and the second critical difference values; and
generating an actual registration value of the registration structure based on the difference between the apparent registration measurement and the alignment error value.

36. The system of claim 35, wherein the method further comprises conveying the actual registration value to an alignment device.

37. A registration system, comprising:
a registration structure comprising first and second components, and a material layer disposed over at least a portion of at least one of the components;
an apparatus comprising a machine readable medium comprising machine readable instructions for causing a computer to perform a method comprising:
a first critical dimension of a registration structure comprising at least two components to be determined, a material layer disposed over at least a portion of at least one of the components;
an apparent registration measurement of the registration structure to be determined;
a second critical dimension of the registration structure to be determined;
a registration measurement error due to asymmetry of the material layer over the at least one component to be determined based on the measurements of the first and second critical dimensions of the registration structure; and
an actual registration value of the registration structure to be determined based on the difference between the apparent registration measurement and the registration measurement error.

38. A registration system, comprising:
a registration structure comprising first and second components, and a material layer disposed over at least a portion of at least one of the components;
an apparatus comprising a machine readable medium comprising machine readable instructions for causing a computer to perform a method comprising:
obtaining a pair of images of a first component of a registration structure, the registration structure comprising a centerline value;
determining an image centerline value of each of the pair of images of the first component;
determining a first offset centerline value by averaging the image centerline values of the first component;
obtaining a pair of images of a second component of the registration structure;
determining an image centerline value of each of the pair of images of the second component;
determining a second offset centerline value by averaging the image centerline values of the second component;
determining a first delta value ($\Delta_1$) by comparing the first and second offset centerline values;
providing flipped images of the first component;
determining an image centerline value for each of the flipped images of the first component;
determining a third offset centerline value by averaging the image centerline values of the flipped images of the first component;
determining a second delta value ($\Delta_2$) by comparing the second and third offset centerline values;
determining a registration measurement error by subtracting the $\Delta_1$ value from the $\Delta_2$ value to provide a $\Delta_s$ value, and averaging the $\Delta_s$ value; and
generating an actual centerline value of the registration structure by subtracting the registration measurement error from the registration structure centerline value.

39. The system of claim 38, wherein the method further comprises conveying the actual centerline value to an alignment device.

40. The system of claim 38, wherein the material layer is asymmetrical relative to the registration structure.

41. The system of claim 38, wherein the registration structure comprises an asymmetrical film.

42. A registration system, comprising:
a registration structure comprising first and second components, and a material layer disposed over at least a portion of at least one of the components;
an apparatus comprising a machine readable medium comprising machine readable instructions for causing a computer to perform a method comprising:
obtaining a pair of images representative of a registration site having a material layer disposed over at least a portion of the registration site;
measuring the pair of images;
flipping the pair of images to obtain flipped images;
measuring the flipped images;
comparing the pair of images to the flipped images to determine the difference between the images and flipped images; and
removing the difference to obtain a true registration site offset value.

43. The system of claim 42, wherein the method further comprises conveying the true registration site offset value to an alignment device.

44. The system of claim 42, wherein the material layer is asymmetrical relative to the registration structure.

45. A registration system, comprising:
a registration structure comprising first and second components, and a material layer disposed over at least a portion of at least one of the components;
an apparatus comprising a machine readable medium comprising machine readable instructions for causing a computer to perform a method comprising:
obtaining an image of a registration structure comprising at least two components and having a material layer disposed over at least a portion of the registration structure;
flipping the image of the registration structure to obtain a flipped image;
generating an actual registration value of the registration structure based on the difference between the registration structure image and the flipped image.

46. A registration system, comprising:
a registration structure comprising first and second components, and a material layer disposed over at least a portion of at least one of the components;
an apparatus comprising a machine readable medium with instructions stored thereon, the instructions when executed operable to cause:
a pair of images of a registration structure to be generated, the registration structure comprising at least two components and having a material layer disposed over at least a portion of at least one of the components;
a pair of flipped images of said registration structure images to be generated; and
an actual registration value of the registration structure to be determined based on the difference between the registration structure images and the flipped images.

47. A registration system, comprising:
a registration structure comprising first and second components, and a material layer disposed over at least a portion of at least one of the components;
an apparatus comprising a machine readable medium comprising machine readable instructions for causing a computer to perform a method comprising:
obtaining a pair of images of a first component of a registration structure, the registration structure comprising a centerline value;
determining an image centerline value of each of the pair of images of the first component;
determining a first offset centerline value by averaging the image centerline values of the first component;
obtaining a pair of images of the second component of the registration structure;
determining an image centerline value of each of the images of the second component;
determining a second offset centerline value by averaging the image centerline values of the second component;
determining a first delta value ($\Delta_1$) by comparing the first and second offset centerline values;
flipping one of the pair of images of the first component to provide a flipped image and a non-flipped image of the first component;
determining an image centerline value of the flipped and the non-flipped images of the first component;
determining a third offset centerline value by averaging the image centerline values of the flipped and the non-flipped images of the first component;
determining a second delta value ($\Delta_2$) by comparing the second and third offset centerline values;
determining a registration measurement error by subtracting the $\Delta_1$ value from the $\Delta_2$ value to provide a $\Delta_s$ value, and averaging the $\Delta_s$ value; and
generating an actual centerline value of the registration structure by subtracting the registration measurement error from the registration structure centerline value.

48. A registration system, comprising:
a registration structure comprising first and second components, and a material layer disposed over at least a portion of at least one of the components;
an apparatus comprising a machine readable medium comprising machine readable instructions for causing a computer to perform a method comprising:
obtaining a pair of images of a first component of a registration structure, the registration structure comprising a centerline value;
flipping one of the pair of images of the first component to provide a first flipped image and a non-flipped image of the first component;
determining an image centerline value of the first flipped and the non-flipped images of the first component;
determining a first offset centerline value by averaging the image centerline values of the first flipped image and the non-flipped image of the first component;
obtaining a pair of images of the second component of the registration structure;
determining an image centerline value of each of the images of the second component;
determining a second offset centerline value by averaging the image centerline values of the second component;
determining a first delta value ($\Delta_1$) by comparing the first and second offset centerline values;
flipping the non-flipped image of the pair of images of the first component to provide first and second flipped images of the first component;
determining an image centerline value of the second flipped image of the first component;
determining a third offset centerline value by averaging the image centerline values of the first and second flipped images of the first component;
determining a second delta value ($\Delta_2$) by comparing the second and third offset centerline values;
determining a registration measurement error by subtracting the $\Delta_1$ value from the $\Delta_2$ value to provide a $\Delta_s$ value; and
generating an actual centerline value of the registration structure by subtracting the registration measurement error from the registration structure centerline value.

49. A registration system, comprising:
a registration structure comprising first and second components, and a material layer disposed over at least a portion of at least one of the components;
an apparatus comprising a machine readable medium comprising machine readable instructions for causing a computer to perform a method comprising:
determining a first critical dimension of a registration structure comprising overlying upper and lower layers, the lower layer comprising a first component and the upper layer comprising a second component, each component having first and second edges, a material layer disposed over at least a portion of the registration structure;

acquiring image data of:
  (i) the first and second edges of the first component;
  (ii) the first and second edges of the second component;
  (iii) an edge of the material layer disposed proximal to the second edge of the first component; and
  (iv) the first or second edge of the first component in relation to the first edge of the second component;

measuring a distance:
  (i) from the first edge to the second edge of the first component to provide a first distance value; and
  (ii) from the first edge of the first component to said edge of the material layer to provide a second distance value;

generating an apparent registration measurement of the first component in relation to the second component by measuring a distance from the first or second edge of the first component to the first edge of the second component;

generating an alignment error value by comparing the first and second distance values, the alignment error value corresponding to a distance from said edge of the material layer and the second edge of the first component; and generating an actual registration value by comparing the apparent registration measurement and the alignment error value, the actual registration value corresponding to the position of the first component relative to the second component.

50. A registration system, comprising:

a registration structure comprising first and second components, and a material layer disposed over at least a portion of at least one of the components;

an apparatus comprising a machine readable medium comprising machine readable instructions for causing a computer to perform a method comprising:

obtaining at least two images of a first component of a registration structure, the registration structure comprising a centerline value;

flipping one of the two images of the registration structure to obtain a flipped image and a non-flipped image;

generating an actual registration value of the registration structure by comparing the flipped image to the non-flipped image to obtain a value of the difference between the images.

51. A registration system, comprising:

a registration structure comprising first and second components, and a material layer disposed over at least a portion of at least one of the components;

an apparatus comprising a machine readable medium with instructions stored thereon, the instructions when executed operable to cause:

at least two images of a first component of a registration structure to be generated, the registration structure comprising at least two components and having a material layer disposed over at least a portion of at least one of the components, the registration structure comprising a centerline value;

a flipped image of one of the two images of said registration structure to be generated; and an actual registration value of the registration structure to be determined based on the difference between the flipped image and the other of the images.

* * * * *

UNITED STATES PATENT AND TRADEMARK OFFICE
CERTIFICATE OF CORRECTION

PATENT NO.       : 7,127,319 B2
APPLICATION NO. : 10/932771
DATED            : October 24, 2006
INVENTOR(S)      : Erik Byers and Steve W. Bowes It is certified that error appears in the above-identified patent and that said Letters Patent is hereby corrected as shown below:

Column 14, line 1: Replace "12" with --$I_2$--.
Column 14, line 21: Replace "I2F" with --$I_{2F}$--.

Signed and Sealed this

Twentieth Day of November, 2007

JON W. DUDAS
*Director of the United States Patent and Trademark Office*